US010692690B2

(12) United States Patent
Anantha et al.

(10) Patent No.: US 10,692,690 B2
(45) Date of Patent: Jun. 23, 2020

(54) CARE AREAS FOR IMPROVED ELECTRON BEAM DEFECT DETECTION

(71) Applicant: KLA-Tencor Corporation, Milpitas, CA (US)

(72) Inventors: Vidyasagar Anantha, Hyderabad (IN); Arpit Yati, Uttar Pradesh (IN); Saravanan Paramasivam, Chennai (IN); Martin Plihal, Pleasanton, CA (US); Jincheng Lin, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/639,311

(22) Filed: Jun. 30, 2017

(65) Prior Publication Data

US 2018/0277337 A1    Sep. 27, 2018

Related U.S. Application Data

(60) Provisional application No. 62/477,270, filed on Mar. 27, 2017.

(51) Int. Cl.
*H01J 37/00* (2006.01)
*H01J 37/244* (2006.01)
*H01J 37/28* (2006.01)
*H01J 37/20* (2006.01)

(52) U.S. Cl.
CPC ............ *H01J 37/244* (2013.01); *H01J 37/20* (2013.01); *H01J 37/28* (2013.01); *H01J 2237/24592* (2013.01); *H01J 2237/2817* (2013.01)

(58) Field of Classification Search
CPC .. H01J 37/00; H01J 37/02; H01J 37/21; H01J 37/22; H01J 37/222; H01J 37/224; H01J 37/226; H01J 37/228; H01J 37/24; H01J 37/244; H01J 37/26; H01J 37/261
USPC ......................................... 250/306, 307, 311
See application file for complete search history.

(56) References Cited

U.S. PATENT DOCUMENTS

| 7,877,722 | B2 | 1/2011 | Duffy et al. |
| 2009/0230303 | A1* | 9/2009 | Teshima ................. H01J 37/28 250/310 |
| 2012/0245861 | A1 | 9/2012 | Greene |
| 2013/0279794 | A1 | 10/2013 | Greenberg et al. |

(Continued)

OTHER PUBLICATIONS

KLA-Tencor, Introduction to Nanopoint, PowerPoint, 15 pages, available at https://www.kla-tencor.com/NanoPoint_Overview.pdf/ download, at least Mar. 29, 2015.

(Continued)

*Primary Examiner* — Jason L McCormack
(74) *Attorney, Agent, or Firm* — Hodgson Russ LLP

(57) ABSTRACT

Use of care areas in scanning electron microscopes or other review tools can provide improved sensitivity and throughput. A care area is received at a controller of a scanning electron microscope from, for example, an inspector tool. The inspector tool may be a broad band plasma tool. The care area is applied to a field of view of a scanning electron microscope image to identify at least one area of interest. Defects are detected only within the area of interest using the scanning electron microscope. The care areas can be design-based or some other type of care area. Use of care areas in SEM tools can provide improved sensitivity and throughput.

20 Claims, 5 Drawing Sheets

(56) References Cited

U.S. PATENT DOCUMENTS

| | | | |
|---|---|---|---|
| 2014/0027635 A1* | 1/2014 | Matsui | H01J 37/026 |
| | | | 250/311 |
| 2014/0219544 A1* | 8/2014 | Wu | G06T 7/001 |
| | | | 382/149 |
| 2014/0301629 A1 | 10/2014 | Ramachandran | |
| 2014/0376802 A1 | 12/2014 | Wu et al. | |
| 2015/0022654 A1 | 1/2015 | Greenberg et al. | |
| 2015/0125065 A1* | 5/2015 | Lee | G06T 5/00 |
| | | | 382/149 |
| 2015/0254394 A1 | 9/2015 | Hu et al. | |
| 2015/0330915 A1* | 11/2015 | Jin | H01L 22/12 |
| | | | 378/62 |
| 2016/0027164 A1 | 1/2016 | Duffy et al. | |
| 2016/0372303 A1* | 12/2016 | Park | H01J 37/222 |

OTHER PUBLICATIONS

WIPO, ISR for PCT/US2018/023910, dated Jul. 17, 2018.

* cited by examiner

Patch Difference/Mask

SEM Ref and Def

Patch Ref and Def

CARE AREAS FOR IMPROVED ELECTRON BEAM DEFECT DETECTION

CROSS-REFERENCE TO RELATED APPLICATIONS

This application claims priority to the provisional patent application filed Mar. 27, 2017 and assigned U.S. App. No. 62/477,270, the disclosure of which is hereby incorporated by reference.

FIELD OF THE DISCLOSURE

This disclosure relates to defect detection with a review tool.

BACKGROUND OF THE DISCLOSURE

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of shapes (polygons) that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an inter-level dielectric, or an interconnect pattern on a metallization layer.

Fabricating semiconductor devices, such as logic and memory devices, typically includes processing a substrate like a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a single semiconductor wafer and then separated into individual semiconductor devices.

Inspection methods are used at various steps during a semiconductor manufacturing process to detect defects on wafers to promote higher yield in the manufacturing process. As the dimensions of semiconductor devices decrease, inspection becomes even more important to the successful manufacture of acceptable semiconductor devices because smaller defects may cause the devices to fail.

Optical inspection of a semiconductor wafer during manufacturing is generally a slow, manual process. Defect teams at semiconductor fabrication plant (fabs) usually use optical based tools for wafer inspection, but typically perform scanning electron microscope (SEM) review of defects for verification. Thus, for every layer inspected on an optical inspection tool, a sampled population of defects is then reviewed on an SEM tool. Manual classification of the reviewed defects is tedious and time-consuming. Fabs use many automatic detection and classification schemes to save the time and effort involved in defect classification. However, the automatic detection and classification schemes have limitations and are not a replacement for a human classification. One aspect of this flow is automatic defect detection, which involves subtraction of reference and defect sites to locate the defect. A previous technique involved subtracting the whole images within certain field of view (FOV) with the defect image. Besides requiring large computation power, this technique increased the probability of including a nuisance or instances of multiple, non-important defects. This subtraction technique also is non-selective and will have reduced defect of interest (DOI) selectivity for SEM detection.

Also when semiconductor fabs use optical inspector tools for monitoring defects on the wafer, the inspection recipe on the optical inspector tool is optimized for DOI. If an automated SEM detection and classification system is used for defects coming from an optical inspector source, a nuisance on the wafer could have an adverse impact. In such a case, though the optical inspector tool found the DOI, it might get reported into a nuisance bin by the automated SEM detection and classification system. A nuisance also can be reported in a defect bin.

Previous methods for SEM automatic wafer detection and classification that are used for reviewing defects from an optical inspection source do not have an effective mechanism to control the detection of prominent nuisance present on the wafer. These methods have at least the following limitations. First, these methods lack region-specific (e.g., care area) defect selectivity. Second, these methods have higher throughput costs for detection because these methods process complete SEM images within FOV for detection even if part of FOV is not an area of interest. Third, these methods have misdetection problems that lead to higher misclassification. Fourth, SEM detection optimization is cumbersome because current algorithms are forced to deal with all the pixels in the FOV, many of which contribute to misdetection problems while being of no interest.

Methods for integrating design into a review tool, such as an SEM, do not yet solve the problems and drawbacks of the previous methods. Therefore, what is needed is an improved defect detection technique with a review tool, and, more particularly, and improved electron beam defect detection technique.

BRIEF SUMMARY OF THE DISCLOSURE

In a first embodiment, a method is provided. A care area is received at a controller for a scanning electron microscope. The care area is defined by an inspector tool separate from the scanning electron microscope. Using the controller, the care area is applied to a field of view of the scanning electron microscope image to identify at least one area of interest. Defects are detected only within the area of interest using the scanning electron microscope. The inspector tool may be a broad band plasma tool.

The care area can be defined based on a design file corresponding to the area of interest. The care area also may be a polygon-shaped zone or design coordinates.

Detecting can include using design referenced defect location accuracy defect coordinates from the inspector tool with a bounding box.

An estimated defect location accuracy of each defect identified by the inspector tool can be encoded as a defect attribute during the applying.

Using the controller, a recipe for the scanning electron microscope can be optimized based on the care area.

Using the controller, defects can be binned based on the care area.

In a second embodiment, a scanning electron microscope is provided. The scanning electron microscope includes an electron beam source configured to generate an electron beam; a stage configured to hold a wafer; a plurality of optical elements along a path of the electron beam between the electron beam source and the stage; a detector; and a controller in electronic communication with the detector. The controller is configured to: receive a care area from an inspector tool that is separate from the scanning electron microscope; apply the care area to a field of view of an image to identify at least one area of interest on a surface of the wafer; and detect defects on the wafer only within the area of interest. The inspector tool may be a broad band plasma tool. The broad band plasma tool can be in electronic communication with the controller.

In a third embodiment, a non-transitory computer readable medium is provided. The non-transitory computer readable medium stores a program configured to instruct a processor to: receive a care area for a scanning electron microscope, wherein the care area is defined by an inspector tool separate from the scanning electron microscope; apply the care area to a field of view of a scanning electron microscope image to identify at least one area of interest; and detect defects only within the area of interest using a scanning electron microscope.

The care area can be defined based on a design file corresponding to the area of interest. The care area also may be a polygon-shaped zone or design coordinates.

Detecting the defects can include using design referenced defect location accuracy defect coordinates from the inspector tool with a bounding box.

An estimated defect location accuracy of each defect identified by the inspector tool can be encoded as a defect attribute while applying the care area.

A recipe for the scanning electron microscope can be optimized based on the care area.

The defects can be binned based on the care area.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein improve the efficiency of detection algorithms by reducing the amount of image processing needed and increasing the probability of filtering important DOIs using care areas. The care areas can be design-based or some other type of care area. For example, the care areas can be manually set by a user. Use of care areas in SEM tools can provide improved sensitivity and throughput.

Detection algorithm performance is limited by nuisances that are present on the wafer. This is a problem for optical as well as SEM detection algorithms. Tiny care areas (CAs) for inspection can potentially overcome this problem. It is possible to define 250 nm×250 nm care areas for inspection. Improved defect location accuracy (DLA) between broadband plasma (BBP) and electron beam tools can enable better detection. DLA relates to how accurately the coordinate systems of two tools can be matched so that defects reported by one tool can be visited by the other tool. For example, DLA can be the accuracy with which an inspector reported defect can be located by an SEM review tool. Despite improved DLA, detection problems are not completely solved because DOI and nuisances can still be present within FOV of SEM images used for detection. If the nuisance is more obvious on the SEM image, even though it is of no interest to the users, SEM detection may lead to detection of nuisance. Since the defect classification relies on defect detection, it can lead to incorrect classification of the defect too.

A nuisance can be any deformation which is not critical for the process. The deformity can still be different from the reference site but it does not impact the yield. Common nuisance includes line edge roughness or any other small variations which are non-critical.

Figure 1:
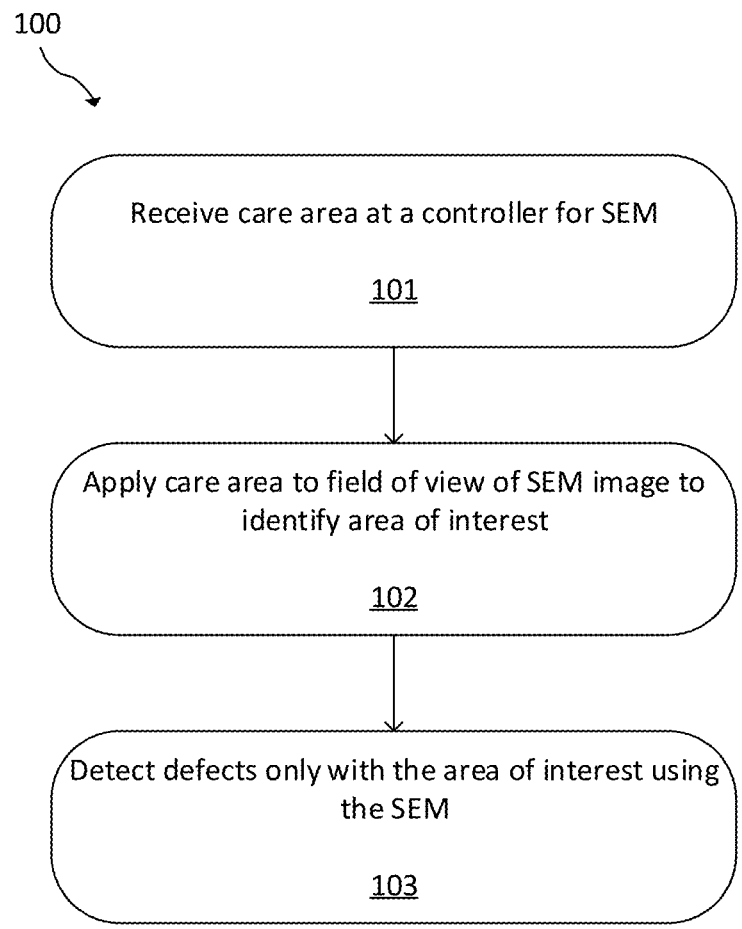
FIG. 1 is a flowchart of an embodiment of a method in accordance with the present disclosure.

FIG. 1 is a flowchart of an embodiment of a method 100. At 101, at least one care area is received at a controller for an SEM. The care area can be defined by an inspector tool separate from the SEM, such as a BBP tool. Besides BBP tool care areas, the care areas from any inspection tool, such as dark field (laser scan) inspection tools, can be used for SEM defect detection. The care area also can be defined based on a design file corresponding to the area of interest (AOI). While design-based care areas may be particularly effective, regular care areas for inspection also can be used.

As used herein, a "design file" generally refers to the physical design (layout) of an IC and data derived from the physical design through complex simulation or simple geometric and Boolean operations. A semiconductor device design is verified by different procedures before production of ICs. For example, the semiconductor device design may be checked by software simulation to verify that all features will be printed correctly after lithography in manufacturing. In addition, an image of a reticle acquired by a reticle inspection system and/or derivatives thereof may be used as a proxy or proxies for the design file. Such a reticle image or a derivative thereof may serve as a substitute for the design layout in embodiments described herein that use a design file.

A care area is an area of the wafer (or die on the wafer) that is desired to be inspected by the SEM tool or other review tool. The care area is usually smaller than the FOV. An FOV may include one or more care areas.

The design file may include care areas. The same care area may be used on the inspector tool (e.g., the BBP tool) and the review tool (e.g., the SEM).

In an instance, the care area is a polygon-shaped zone. Other zone shapes for the care area are possible. The care areas also can be represented as design coordinates or attributes for inspection. Optical images are aligned with a design file or design clip at various anchor sites that have unique features, such as by using an image alignment algorithm. Care areas also can be aligned with SEM review tool coordinate system using anchor sites with unique features.

At 102, each of the care areas is applied, using the controller, to an FOV of a scanning electron microscope image to identify at least one AOI. At 103, the scanning electron microscope is used to detect defects only within the AOI. After the design is aligned on with the SEM review tool, care areas (e.g., marked on a design file) can be projected on the SEM. The AOI is the area within the care area as the defect caught by inspector will likely only lie within this region. Using embodiments disclosed herein, the AOI is restricted by using care areas for defect detection. Previously, anything in the whole SEM FOV could be re-detected and reported as defect. With care areas only a small portion of the SEM FOV inside the care area will be used for detection. Anything outside the care area will not be redetected or reported by the SEM.

Tiny care areas with BBP inspection can be used for improved defect detection. Capabilities of the tiny care areas, like with a BBP inspection, can be applied to SEM detection. In an embodiment, an inspection tool (e.g., a BBP tool) care areas or design information are created for an AOI. An example of design information is NanoPoint design care area (NPDCA). NPDCA can be a targeted inspection of patterns, which improves signal-to-noise ratio for yield-critical defects. NPDCA is disclosed in, for example, U.S. Pat. No. 7,877,722, which is incorporated by reference in its entirety. The size of the NPDCA may vary depending on the target wafer, patterns of interest, or other factors.

The BBP tool inspects a wafer using the care areas or NPDCA, such as to find a lot result. The defects are then sent for review at a review tool, such as an SEM. A care area group (CAG) is an attribute in a KLARF file. Design information (e.g., NPDCA) can be shared between the inspection tool and the review tool. Defects from optical sources can be reviewed in the review tool with a specified FOV. Care areas or NPDCA can be used to identify AOI with the FOV. Automatic SEM detection may only be performed in the AOI. This reduces nuisances and can provide improved classification.

The FOV may be considered to be the maximum usable view area of the electron-beam imaging column with acceptable aberrations and performance of the electron beam optics. The electron beam may be deflected by the apparatus to any point in the FOV. While the FOV may be circular in shape, a largest inscribed square within the circle is typically used for purposes of imaging in inspection. The width of the FOV may be measured in microns.

The care areas can be used for SEM defect detection, SEM recipe optimization, binning, or other techniques. The order in which care areas are arranged for inspection can have an impact on the sensitivity and the CAG can be used for binning.

Using care area information with SEM detection (including the care area group that a defect belongs to) can provide the ability to perform at least one level of binning and also can aid in granular binning capabilities. For example, a BBP tool can separate DOI in NMOS and PMOS regions. However, nuisances (e.g., line edge roughness) from one of these regions could impact the sensitivity of another region during SEM detection. With the embodiments disclosed herein, it is possible to focus on a region of interest during SEM detection and provide more accurate binning than before.

Pattern matching for improved SEM detection can be performed. Pattern matching may be used to find all locations in the chip design file (GDS) of a particular pattern. This functionality can be used to define care areas for BBP inspection based on a known pattern in the design, such as hot spot care areas. A systematic design defect (e.g., from SEM images) can be found. How much of the pattern around the defect is relevant can be manually defined. This may be a rectangle around the defect with size of approximately 200-300 nm, though other shapes or sizes are possible. A pattern search can then be performed through the entire design file to find all instances of this pattern on the die, and care areas can be automatically created in the found locations. In an instance, a pattern search is used on an electron beam tool to identify the relevant part in the FOV of the SEM image where the defect can be detected. This may be performed for hot spot review, such as for a known hot spot.

In an example, design referenced defect location accuracy (DDLA) defect coordinates from a BBP tool can be used with a bounding box based on coordinate uncertainty to achieve the maximum DLA on the SEM tool. The uncertainty-base bounding box can vary from defect to defect depending on the pixel design alignment (PDA) score, which refers to design to optical image alignment and the score indicates how well the alignment is. The use of the uncertainty bounding box can provide improved coordinate accuracy for SEM re-detection, even in cases when Nano-Point care areas are large.

Figure 2:
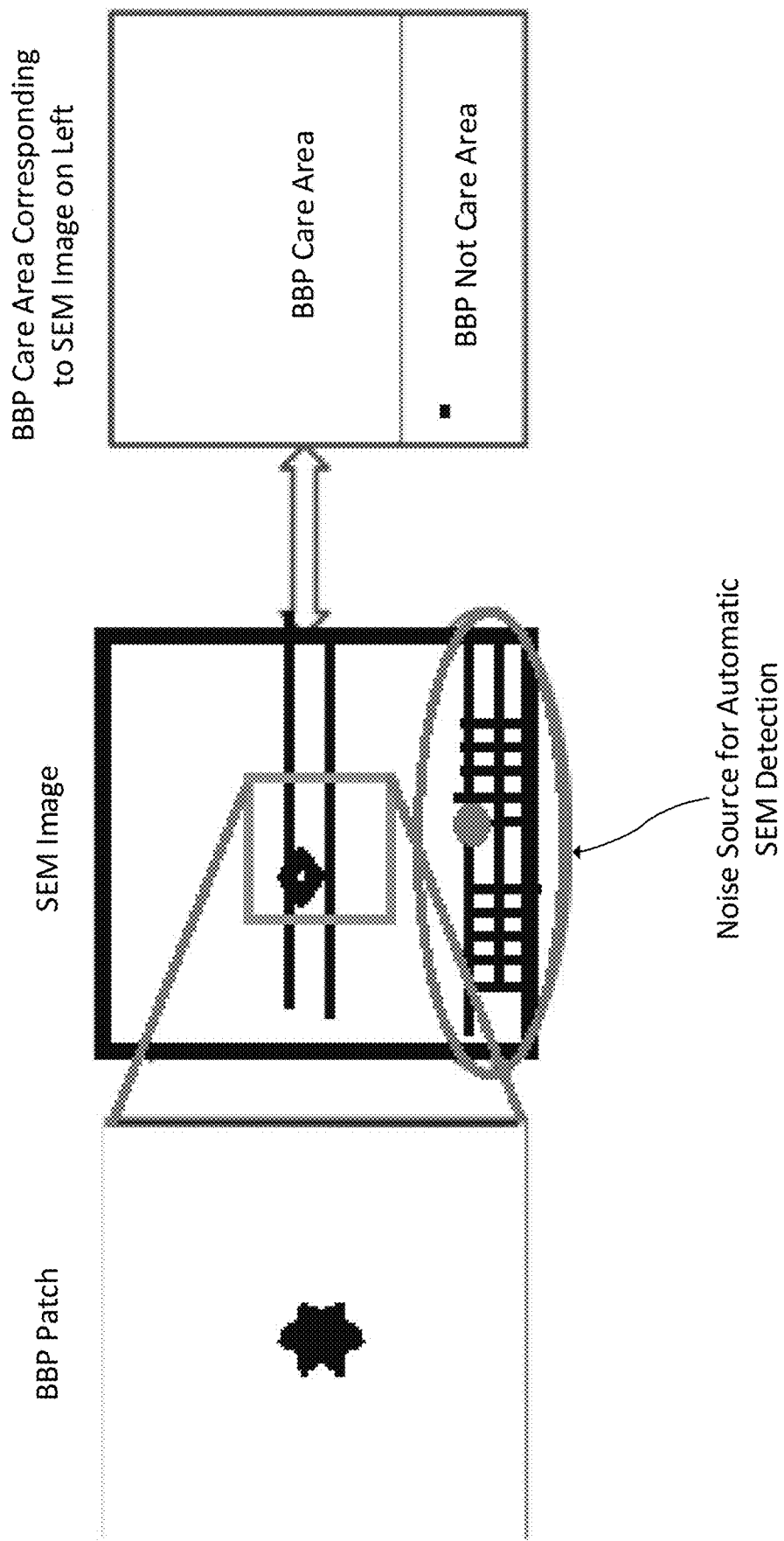
FIG. 2 is a diagram illustrating benefits of using BBP tool care areas for automatic SEM detection.

FIG. 2 illustrates benefits of using BBP tool care areas for automatic SEM detection. In the example, automatic SEM detection algorithms always point to multiple defects within the FOV. For example, see the circled area at the bottom of FIG. 2 marked as a noise source for automatic SEM detection. Since the DOI on this layer are the ones closest to the noise source, it may not be possible to reduce the FOV to completely avoid noise. While the BBP tool can successfully detect the defect, automatic SEM defect detection schemes would fail to effectively point to the DOI.

Figure 3:
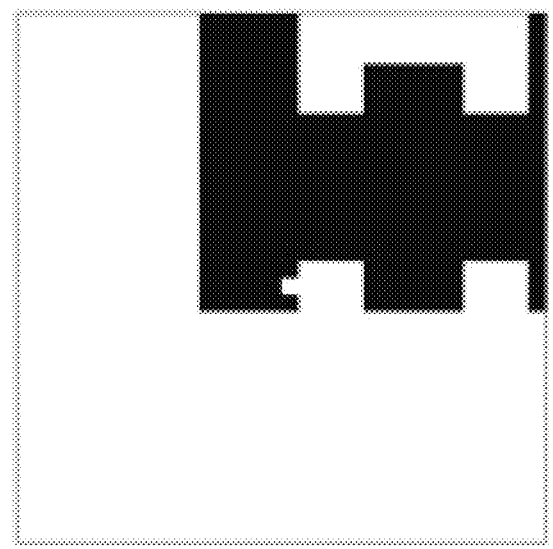
FIG. 3 is a diagram illustrating defects caught outside of a BBP tool care area by SEM detection.
Figure 3:
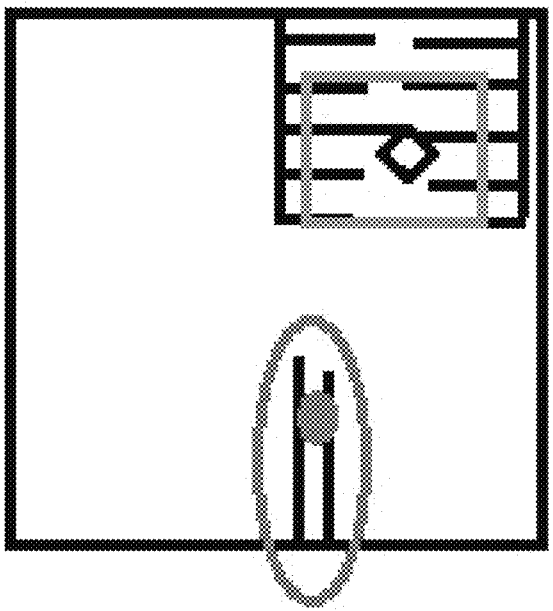
Figure 3:
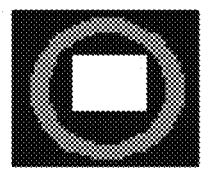
Figure 3:

FIG. 3 is a diagram illustrating defects caught outside of a BBP tool care area by SEM detection. FIG. 3 shows the detection in BBP and also the detection in an SEM image, but multiple locations are detected in the SEM image and a mask corresponds to the care areas and shows defects detected inside and outside the BBP care areas.

Figure 4:
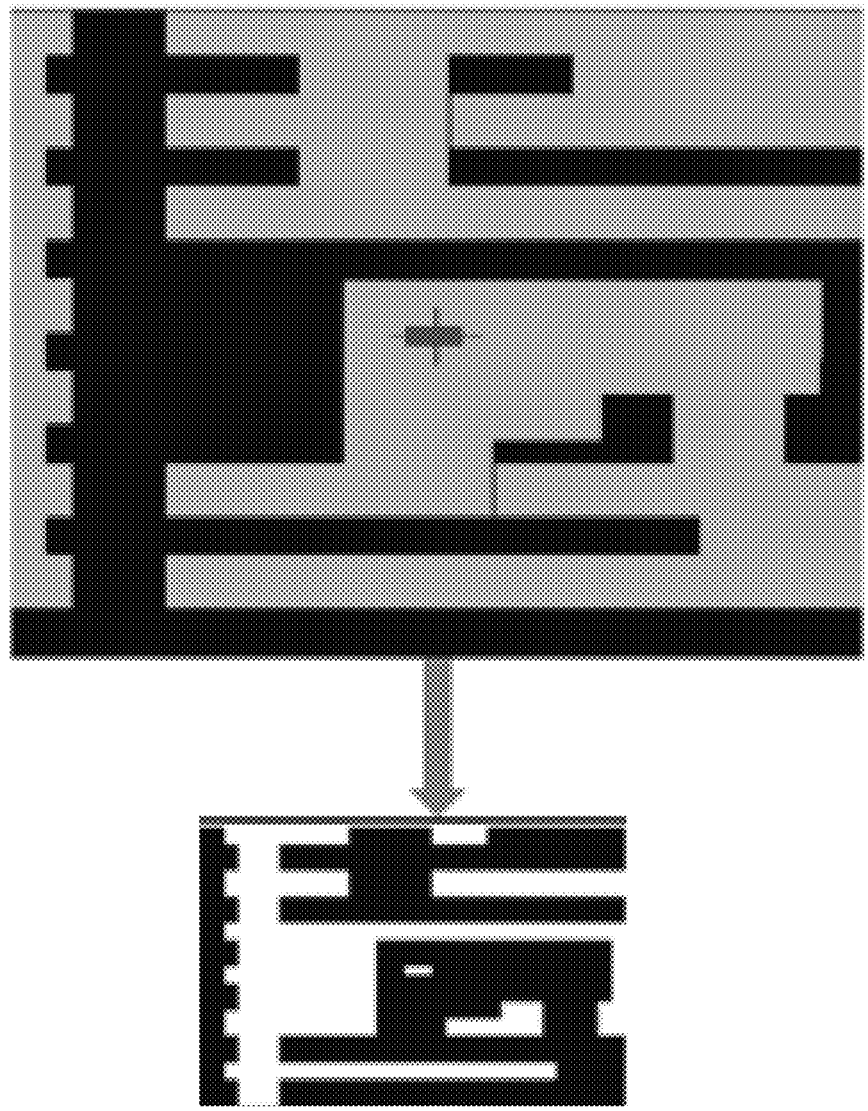
FIG. 4 is a diagram illustrating BBP tool care areas used for BBP inspection.

FIG. 4 is a diagram illustrating BBP tool care areas used for BBP inspection. When design care areas are used, it can ensure that defects are detected within BBP care areas and defects from outside the care areas are avoided.

Design-based care areas created for BBP tool inspection can be used in SEM defect detection so that detection is focused on DOI. Optical inspection care areas for SEM detection provide great flexibility to optimize SEM imaging and detection in each of the care area groups, which can be performed separately when needed. This flexibility may be particularly helpful because DOI often come from specific regions of interest. For example, different imaging conditions and different detection parameters can be used for different CAG coming from an inspector tool.

In an example, a user can define care areas on the SEM tool and those care areas can be used for defect detection. This capability can be supported via integration of pattern matching algorithms for the purpose of using care areas defined on SEM images for defect detection (e.g., review of hotspot inspection). If no care areas are provided by an inspector tool, within an FOV used for hotspot review, a user can define care areas during defect detection setup. Runtime pattern matching algorithms can be used in conjunction with other embodiments disclosed herein.

In another example, an estimated DLA of each defect on the BBP tool is encoded as a defect attribute. This technique can provide additional benefits. The value for a new defect attribute may depend on the image to design alignment score for NanoPoint inspection, and may be constant for non-NanoPoint inspections. Using this technique, the proposed defect attribute is never larger than the care area and, thus, may never provide worse DLA than the method based on care areas. DLA improvements for large NanoPoint care areas can be achieved. Even in these cases, this method can take advantage of DDLA and the PDA scores to provide improved DLA information to the SEM review tool. It is also applicable to non-NanoPoint inspection. In such an instance, the DLA bounding box may be large, but still smaller than the typical FOV used for detection on SEM tools.

Defect location can never be outside of its care area, because inspection is not typically performed outside of care areas. Thus, if the NanoPoint care area is smaller than the DLA for that defect, the care area itself bounds the location inaccuracy. If the NanoPoint care area is large, it may be useful to use the PDA score, which is generated during inspection and stored as a defect-level attribute, to estimate the DLA-bounding box. The better the PDA score, the better the DLA. These techniques also can be applied to care areas that are not NanoPoint care areas.

Performance of the SEM detection algorithm may be dependent on optimization of the detection algorithm. For example, the algorithm setup can be optimized for improved performance. With care areas SEM detection, algorithms may only need to detect defects within the care area. Anything outside the care area may not be processed by the detection algorithm, which reduces computation time and the possibility of catching any nuisance outside the care area.

The embodiments disclosed herein provide multiple benefits. First, a focused care area for defect detection enables nuisance suppression during SEM detection. Current automatic defect detection techniques have limits when multiple defects are within an FOV. The limiting nuisance across an FOV can be suppressed. Real defects which are not of interest can be suppressed. This can enable a more accurate report of key DOI.

Second, more flexibility in detection optimization using care area information can be provided. With smaller care areas, SEM detection algorithms can be tweaked to be more sensitive to detect a defect without increasing the risk of catching nuisance. Nuisance outside the care areas (like line edge roughness) need not be taken care of separately to remove it from detection because the algorithm will not process anything outside the care areas. Similarly, any other defect type lying outside the care area need not be taken care of because the algorithm will not process those portions of the image.

Third, reference and defect image alignment issues can be partially mitigated with pointed care area SEM defect detection. Reference and defect image misalignment can lead to false defect capture anywhere in the FOV. Care areas reduce the area in which false defect can be captured.

Fourth, throughput can be improved because fewer numbers of pixels are processed for defect detection, complexity in detection optimization is reduced, and classification is improved.

Fifth, the SEM tools can be more integrated with inspector tools, such as BBP tools. This enables communication of care areas between the inspector tool and the SEM tool. The use of DDLA capabilities from BBP tools along with the proposed defect-specific DLA bounding box provides advantages, especially in cases where the NanoPoint care areas are relatively large because it can be used even for non-NanoPoint inspections. Uncertainty can encode the coordinate accuracy at a particular confidence level, and can provide the best possible DLA information on SEM tools for improved SEM sensitivity.

Figure 5:
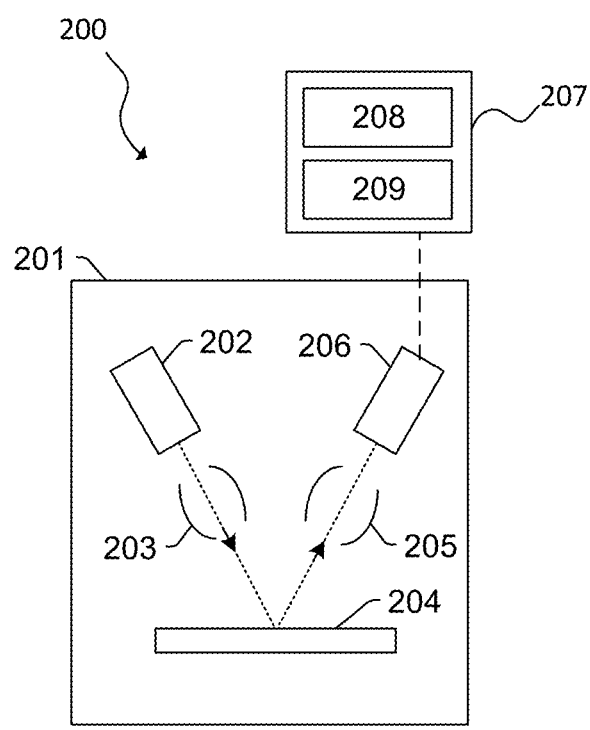
FIG. 5 is a block diagram of an exemplary scanning electron microscope that can perform the embodiments disclosed herein.

The embodiments described herein may include or be performed in a system, such as the system 200 of FIG. 5. The system 200 includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source 202, which can include or be coupled with an extractor or extractor system as disclosed herein. In one such embodiment shown in FIG. 5, the output acquisition subsystem includes electron optical column 201, which is coupled to controller 207. The controller 207 can include one or more processors 208 and one or more memory 209. In an embodiment, the one or more processors 208 are communicatively coupled. In this regard, the one or more processors 208 may receive the image of the wafer 204 and store the image in the memory 209 of the controller 207.

As also shown in FIG. 5, the electron optical column 201 includes electron beam source 202 configured to generate electrons that are focused to the wafer 204 by one or more elements 203. The electron beam source 202 may include an emitter and one or more elements 203 may include, for example, a gun lens, an anode, a beam limiting aperture, a gate valve, a beam current selection aperture, an objective lens, and/or a scanning subsystem. The electron column 201 may include any other suitable elements known in the art. While only one electron beam source 202 is illustrated, the system 200 may include multiple electron beam sources 202.

Electrons returned from the wafer 204 (e.g., secondary electrons) may be focused by one or more elements 205 to the detector 206. One or more elements 205 may include, for example, a scanning subsystem, which may be the same scanning subsystem included in element(s) 203. The electron column 201 may include any other suitable elements known in the art.

Although the electron column 201 is shown in FIG. 5 as being configured such that the electrons are directed to the wafer 204 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

The controller 207 may be in electronic communication with the detector 206. The detector 206 may detect electrons returned from the surface of the wafer 204 thereby forming electron beam images of the wafer 204. The electron beam images may include any suitable electron beam images. Controller 207 may be configured to perform other functions or additional steps using the output of the detector 206 and/or the electron beam images. For example, the controller 207 may be programmed to perform some or all of the steps of FIG. 1.

It is noted that FIG. 5 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the system described herein or components thereof may be implemented using an existing system (e.g., by adding functionality described herein to an existing system). For some such systems, the methods described herein may be provided as optional functionality of the system (e.g., in addition to other functionality of the system).

While disclosed as part of a defect review system, the controller 205 or methods described herein may be configured for use with inspection systems. In another embodiment, the controller 205 or methods described herein may be configured for use with a metrology system. Thus, the embodiments as disclosed herein describe some configurations for classification that can be tailored in a number of manners for systems having different imaging capabilities that are more or less suitable for different applications.

In particular, the embodiments described herein may be installed on a computer node or computer cluster that is a component of or coupled to the detector 206 or another component of a defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 200 shown in FIG. 5 can be modified as described above based on the specimen for which it will generate output.

The controller 207, other system(s), or other subsystem(s) described herein may take various forms, including a personal computer system, workstation, image computer, mainframe computer system, workstation, network appliance, internet appliance, parallel processor, or other device. In general, the term "controller" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

In another embodiment, the controller 207 may be communicatively coupled to any of the various components or sub-systems of system 200 in any manner known in the art. Moreover, the controller 207 may be configured to receive and/or acquire data or information from other systems (e.g., inspection results from an inspection system such as a BBP tool, a remote database including design data and the like) by a transmission medium that may include wireline and/or wireless portions. In this manner, the transmission medium may serve as a data link between the controller 207 and other subsystems of the system 200 or systems external to system 200.

An additional embodiment relates to a non-transitory computer-readable medium storing program instructions executable on a controller for performing a computer-implemented method for using care areas with an SEM tool, as disclosed herein. In particular, as shown in FIG. 5, the controller 207 can include a memory 209 or other electronic data storage medium with non-transitory computer-readable medium that includes program instructions executable on the controller 205. The computer-implemented method may include any step(s) of any method(s) described herein. The memory 209 or other electronic data storage medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes ("MFC"), SSE (Streaming SIMD Extension), or other technologies or methodologies, as desired.

In some embodiments, various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single controller 207 (or computer system) or, alternatively, multiple controllers 207 (or multiple computer systems). Moreover, different sub-systems of the system 200 may include one or more computing or logic systems. Therefore, the above description should not be interpreted as a limitation on the present invention but merely an illustration.

As used throughout the present disclosure, a "wafer" may refer to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art, such as, but not limited to, isolation layers, implantation layers, and the like. The term "wafer" as used herein is intended to encompass a substrate on which any of such layers may be formed.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
receiving a care area of a wafer at a controller for a scanning electron microscope, wherein the care area is defined by an inspector tool separate from the scanning electron microscope using pattern matching performed at the inspector tool, wherein the care area is smaller than a die on the wafer, and wherein the care area is a polygon-shaped zone or design coordinates;
applying, using the controller, the care area to a field of view of a scanning electron microscope image to identify at least one area of interest in the care area, wherein the area of interest is smaller than the care area and larger than a circuit pattern of interest; and detecting defects only within the area of interest using the scanning electron microscope.

2. The method of claim 1, wherein the inspector tool is a broad band plasma tool.

3. The method of claim 1, wherein the care area is defined based on a design file corresponding to the area of interest.

4. The method of claim 1, wherein the care area is the polygon-shaped zone.

5. The method of claim 1, wherein the care area is the design coordinates.

6. The method of claim 1, wherein the detecting includes using design referenced defect location accuracy defect coordinates from the inspector tool with a bounding box.

7. The method of claim 1, wherein an estimated defect location accuracy of each defect identified by the inspector tool is encoded as a defect attribute during the applying.

8. The method of claim 1, further comprising optimizing a recipe for the scanning electron microscope, using the controller, based on the care area.

9. The method of claim 1, further comprising binning the defects, using the controller, based on the care area.

10. A scanning electron microscope comprising:
an electron beam source configured to generate an electron beam; a stage configured to hold a wafer;
a plurality of optical elements along a path of the electron beam between the electron beam source and the stage;
a detector; and
a controller in electronic communication with the detector, wherein the controller is configured to:
receive a care area from an inspector tool that is separate from the scanning electron microscope using pattern matching performed at the inspector tool, wherein the care area is smaller than a die on the wafer, and wherein the care area is a polygon-shaped zone or design coordinates;
apply the care area to a field of view of an image to identify at least one area of interest on a surface of the wafer in the care area, wherein the area of interest is smaller than the care area and larger than a circuit pattern of interest; and
detect defects on the wafer only within the area of interest.

11. The scanning electron microscope of claim 10, wherein the inspector tool is a broad band plasma tool, and wherein the broad band plasma tool is in electronic communication with the controller.

12. A non-transitory computer readable medium storing a program configured to instruct a processor to:
receive a care area of a wafer for a scanning electron microscope, wherein the care area is defined by an inspector tool separate from the scanning electron microscope using pattern matching performed at the inspector tool, wherein the care area is smaller than a die on the wafer, and wherein the care area is a polygon-shaped zone or design coordinates;
apply the care area to a field of view of a scanning electron microscope image to identify at least one area of interest in the care area, wherein the area of interest is smaller than the care area and larger than a circuit pattern of interest; and
detect defects only within the area of interest using the scanning electron microscope.

13. The non-transitory computer readable medium of claim 12, wherein the care area is defined based on a design file corresponding to the area of interest.

14. The non-transitory computer readable medium of claim 12, wherein the care area is the polygon-shaped zone.

15. The non-transitory computer readable medium of claim 12, wherein the care area is the design coordinates.

16. The non-transitory computer readable medium of claim 12, wherein the detecting the defects includes using design referenced defect location accuracy defect coordinates from the inspector tool with a bounding box.

17. The non-transitory computer readable medium of claim 12, wherein an estimated defect location accuracy of each defect identified by the inspector tool is encoded as a defect attribute while applying the care area.

18. The non-transitory computer readable medium of claim 12, further comprising optimizing a recipe for the scanning electron microscope based on the care area.

19. The non-transitory computer readable medium of claim 12, further comprising binning the defects based on the care area.

20. The method of claim 1, wherein the pattern of interest comprises a defect.

* * * * *